United States Patent [19]

Andreano

[11] Patent Number: 4,760,329
[45] Date of Patent: Jul. 26, 1988

[54] PROGRAMMABLE TESTER WITH BUBBLE MEMORY

[75] Inventor: Richard J. Andreano, East Northport, N.Y.

[73] Assignee: Grumman Aerospace Corporation, Bethpage, N.Y.

[21] Appl. No.: 41,572

[22] Filed: Apr. 23, 1987

[51] Int. Cl.⁴ .............................................. G01R 31/28
[52] U.S. Cl. ..................................... 324/73 R; 371/20
[58] Field of Search ............ 324/73 R, 73 AT, 73 PC, 324/158 F; 371/15, 16, 20, 25; 364/580

[56] References Cited

U.S. PATENT DOCUMENTS

| | | | |
|---|---|---|---|
| 3,848,188 | 11/1974 | Ardezzone et al. | 324/73 AT |
| 3,983,383 | 9/1976 | Naden | 364/714 |
| 3,986,016 | 10/1976 | Linn et al. | 364/714 |
| 4,070,565 | 1/1978 | Borelli | 364/580 |
| 4,104,725 | 8/1978 | Rose et al. | 364/580 |
| 4,108,358 | 8/1978 | Niemaszyk et al. | 324/73 AT |
| 4,168,527 | 9/1979 | Winkler | 364/580 |
| 4,212,075 | 7/1980 | Cleversey et al. | 364/580 |
| 4,300,207 | 11/1981 | Eivers et al. | 324/73 R |
| 4,330,838 | 5/1982 | Yoneda et al. | 364/580 |
| 4,354,268 | 10/1982 | Michel et al. | 324/73 R |
| 4,376,298 | 3/1983 | Sokoi et al. | 364/580 |
| 4,397,021 | 8/1983 | Lloyd et al. | 364/580 |
| 4,402,055 | 8/1983 | Lloyd et al. | 324/73 AT |
| 4,429,368 | 1/1984 | Kurii | 364/580 |
| 4,458,197 | 7/1984 | Robinson | 324/73 AT |
| 4,484,329 | 11/1984 | Slamka et al. | 324/73 AT |
| 4,507,740 | 3/1985 | Star et al. | 364/487 |
| 4,517,661 | 5/1985 | Graf et al. | 371/20 |
| 4,616,178 | 10/1986 | Thornton, Jr. et al. | 324/73 R |

OTHER PUBLICATIONS

Sollman, L. C.; "Automatic Test System"; Navy Technical Disclosure Bulletin; vol. 6, No. 4; Apr. 1981; pp. 1–3.

Primary Examiner—Ernest F. Karlsen
Attorney, Agent, or Firm—Pollock, VandeSande & Priddy

[57] ABSTRACT

A portable programmable electronic tester capable of automatically testing a large number of different types of electronic units is disclosed. The operation of the tester is governed by a self-contained microcomputer. A programmable stimulus subsystem provides desired stimuli to a unit under test and a programmable response measuring subsystem measures specified output parameters of the unit under test. A programmable switching subsystem selectively connects the unit under test to the stimulus and response measuring subsystems via an interface device adapted to connect the unit under test to the tester. A test program designed to test the operating characteristics of a particular unit under test is stored in a bubble memory cassette.

5 Claims, 11 Drawing Sheets

PROGRAMMABLE TESTER WITH BUBBLE MEMORY

BACKGROUND OF THE INVENTION

This invention relates to the field of electronic test equipment, and more particularly to a programmable tester capable of automatically testing a variety of electronic units.

With the introduction into the marketplace of sophisticated electronic equipment consisting of analog, digital and hybrid circuitry, there has developed a market for a portable tester capable of automatically testing this equipment. This need for a portable tester is further enhanced when one recognizes that much of the electronic equipment to be tested is itself portable, i.e., it is quite frequently moved and situated at different locations or is part of an operating environment which is portable, such as an aircraft.

A number of systems to measure the response of a unit under test (UUT) to preselected applied stimuli are known in the art. A primary purpose of the known systems has been to determine whether the unit under test is operating, or is operable, in accordance with predefined performance specifications. One of the significant disadvantages of the known systems of this type is that, to a large extent, they have been hard wired and specially configured to test only one or at most a few similar functional UUT's. Accordingly, it has been necessary to maintain a relatively large inventory of such expensive systems where large numbers of unrelated UUT's are to be tested.

One approach which attempts to solve the problems inherent in some of the known systems is described in U.S. Pat. No. 3,764,995. However, the disclosed system has several limitations and drawbacks associated therewith. In particular, its cost and size preclude cost-effective application in many areas of interest. Moreover, it also requires a large, very complex and costly interface device to adapt the unit under test to the tester.

A desirable automatic tester would have several important attributes. In particular, it should be capable of simple, low cost, rapid GO/NO-GO indentification of analog-hybrid-digital modules, present a simple interface to the unit under test, be programmable in a high level language, such as ATLAS, and provide for on-line modificaton of test parameters.

A tester having these attributes is disclosed in U.S. Ser. No. 748,853, assigned to the present assignee. The prior tester essentially incorporated a microcomputer-based test station, a set of test instruments, and test program interface. More particularly, a memory was provided for storing a test program that tested the operation of a unit undergoing test. A microcomputer executed the stored test program. Programmable stimulus generators were connected to the unit undergoing testing and a programmable response measurement apparatus was similarly connected to the unit undergoing testing. A programmable switching means selectively connected the stimulus generating means and the response measuring means. A display was provided for allowing visualization of the testing results.

BRIEF DESCRIPTION OF THE PRESENT INVENTION

The present invention is an improvement over the testing apparatus disclosed in the previously mentioned U.S. Ser. No. 748,853. Like its predecessor the improvement of the present invention incorporates a microcomputer-based test station, a set of test instruments, and test program interface. A major improvement of the present invention is the inclusion of a bubble memory plug-in module which stores the test program. More specifically, the test program for each type of unit to be tested may be stored on a separate bubble memory cartridge which offers great ease of test program modification without the necessity of making such a modification in a hard-wire memory forming part of the system, as was the case in the prior tester.

A further significant improvement of the present invention is the incorporation of analog device selection relays within the instruments themselves, rather than mounting the relays on a separate relay instrument switch card. The movement of the switching relays into the analog devices avoids the necessity of cabling multiple hard wires between the analog devices and instrument switch cards of the prior test instrument. This results in greater reliability of the instrument and lower fabrication costs. Signal communication between the analog devices and the interface, in the present invention, is achieved over an analog switching bus.

The above-mentioned objects and advantages of the present invention will be more clearly understood when considered in conjunction with the accompanying drawings, in which:

DETAILED DESCRIPTION OF THE INVENTION

Figure 1A:
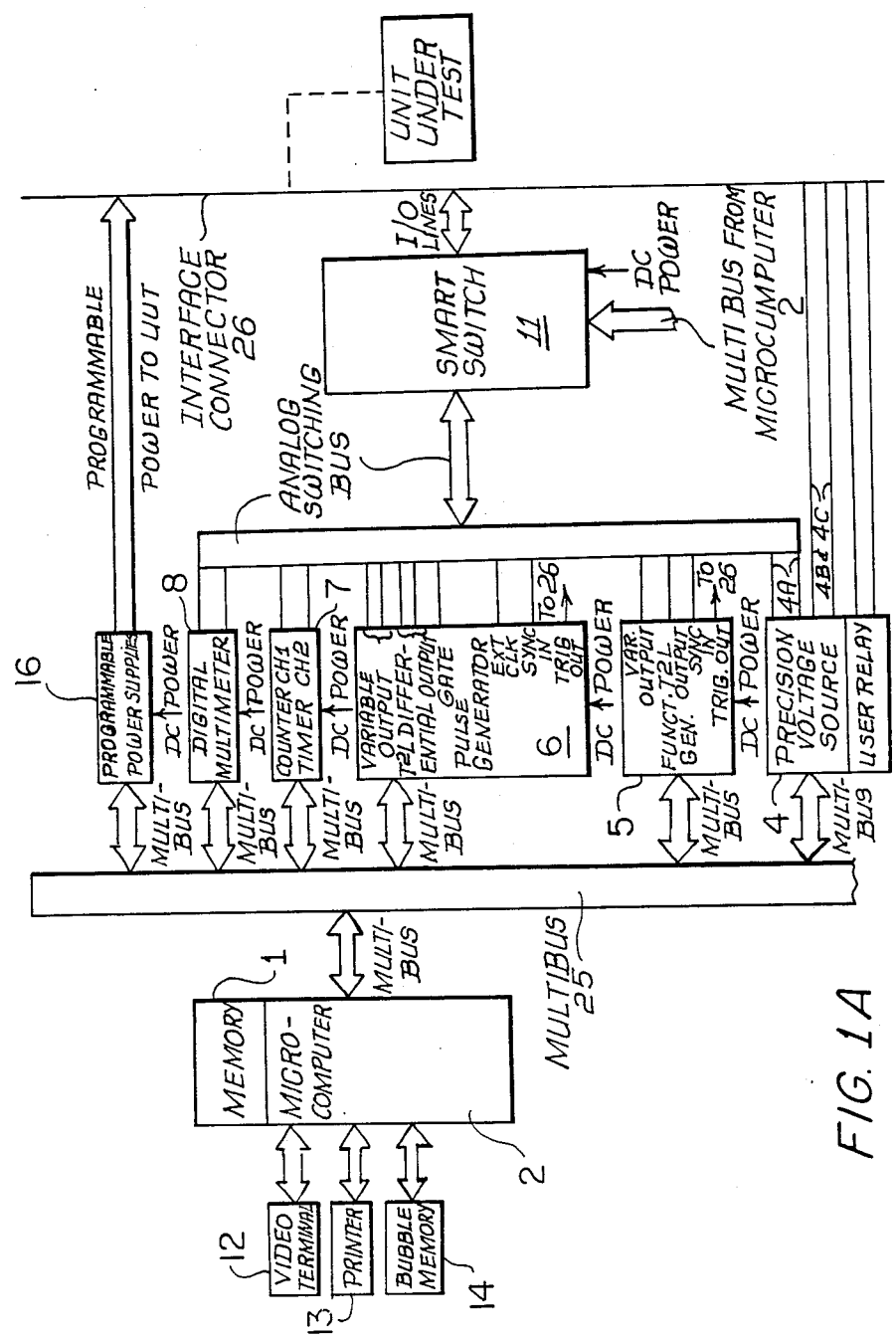
FIG. 1A is a first section of a functional block diagram of the programmable tester, in accordance with the present invention.
Figure 1B:
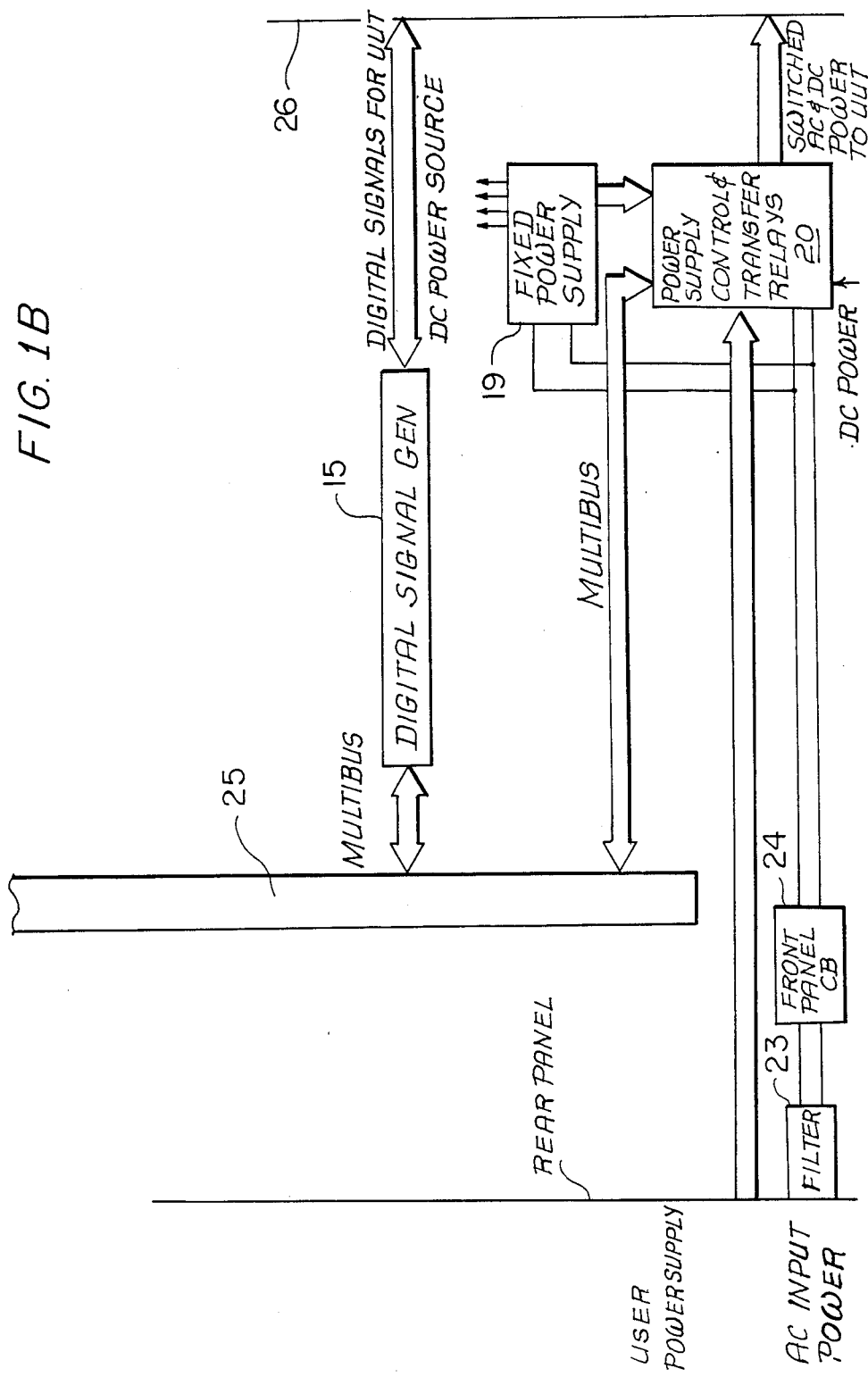
FIG. 1B is a second section of a functional block diagram of the programmable tester, in accordance with the present invention.

Referring to FIGS. 1A and 1B, a block diagram of the programmable tester, in accordance with the present invention, is illustrated. As shown therein, the tester consists of a number of functional units, each of which is described below.

A microcomputer 2, such as the Intel iSBC 86/35, contains the necessary non-volatile (EPROM/ROM) and volatile (RAM) memory. The RAM is divided into functional areas. The first area of RAM is reserved for holding the test executive program when it is read from a bubble memory. The test executive program is comprised of the instrument handlers and the interpreter for the intermediate code version of the ATLAS test program, the latter program used extensively by the military.

A second area of RAM is reserved for holding the IC form of the test program when it is read from a bubble memory 14 (FIG. 1A). The remaining portion of the RAM is used for scratchpad, interrupt addresses, stack, etc. The EPROM/ROM contains monitor, self-test programs, interrupt handling routines, and a program for reading the test executive and IC test program from the bubble memory 14 into the RAM. Other stored programs include a program for controlling the alphanumeric/graphics display on terminal 12 and printer 13, and a program for reading and writing to a keyboard of terminal 12. Bubble memory 14, terminal 12 and printer 13 are connected to microcomputer 2 as shown in FIG. 1A.

The instrument handlers accept parameters and commands from the interpreter and send parameters and commands to the instruments. The instrument handlers can also read information back from the instruments and pass the information back to microcomputer 2 for use by the test program. Communication between the instruments and non-volatile memory 1 is via the system bus 25 which may consist, for example, of an Intel Multibus.

Figure 2A:
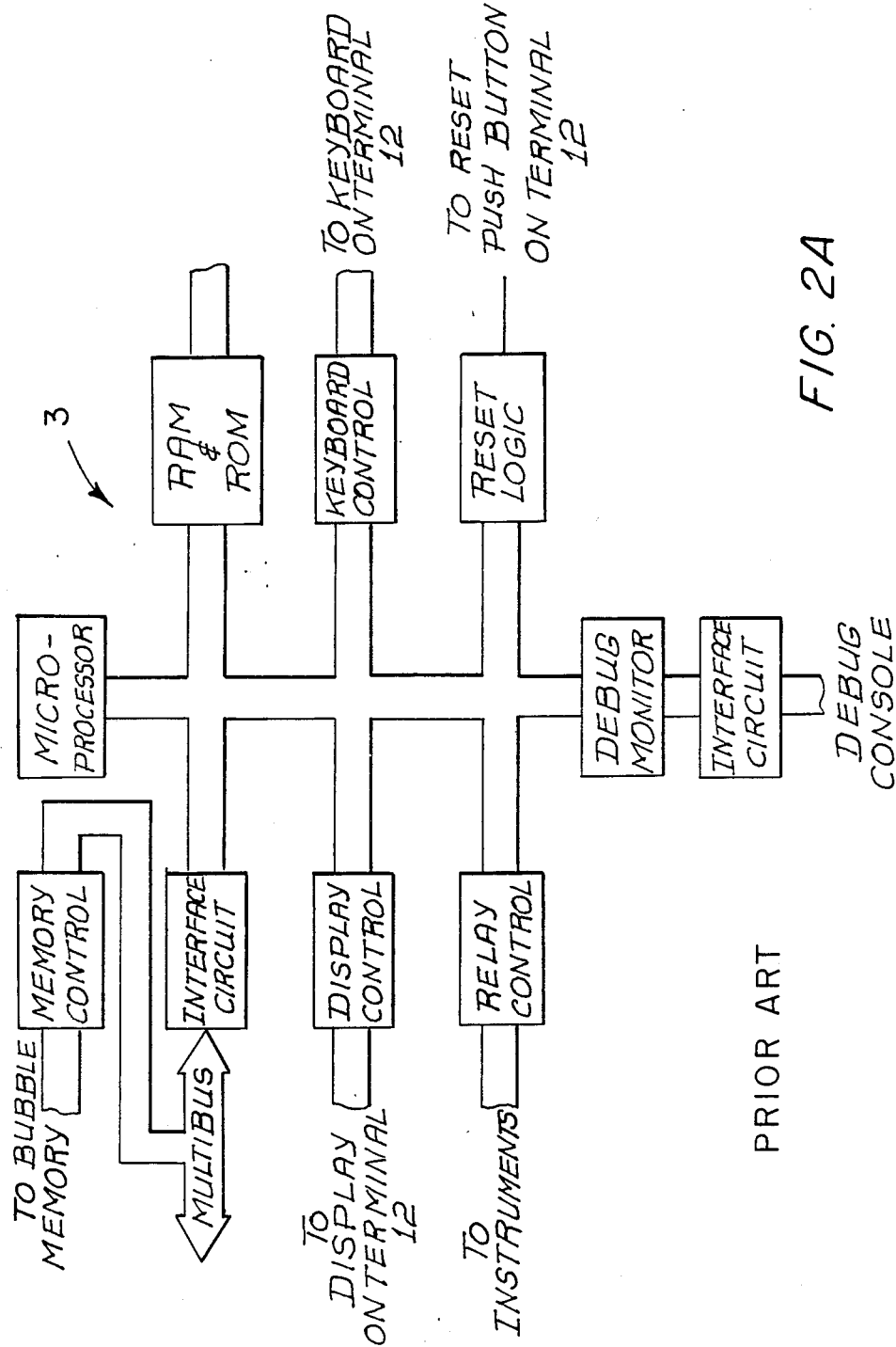
FIG. 2A is a functional block diagram of a programmable microcomputer.
Figure 2B:
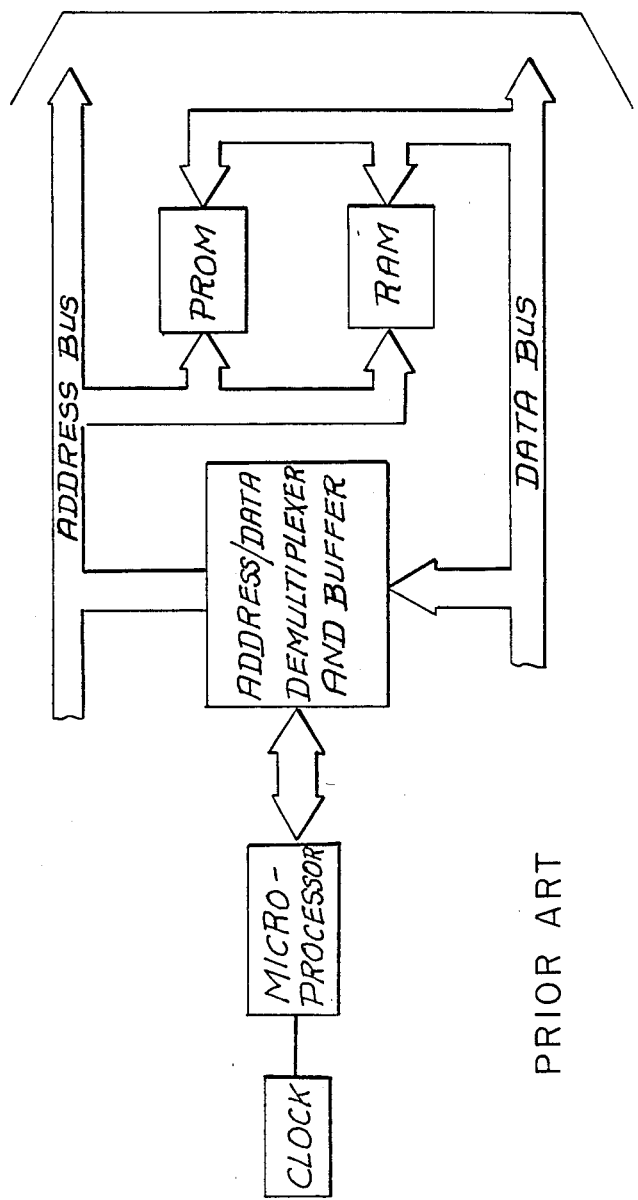
FIG. 2B illustrates in more detail the relay control portion of the microcomputer.

A functional block diagram of the programmable microcomputer 3 and a block diagram of the relay control portion thereof are illustrated in FIGS. 2A and 2B, respectively. The microcomputer performs several functions. In particular, it provides an interface between bubble memory 14 and the system bus 25. This enables loading of test programs from the bubble memory 14 into a RAM in the microcomputer 2. The microcomputer 2 contains the program necessary to determine the proper relay paths in the instruments 4-8 to close in order to connect an instrument to the proper terminals of smart switch 11 (and thereafter the proper pin of connector 26) from the parameter information passed to it by the switching circuit instrument driver. The basic operational details thereof are described in U.S. Pat. No. 4,300,207, granted on Nov. 10, 1981, to Donald J. Eivers and Eddie J. Kovacs, entitled "Multiple Matrix Switching System," and assigned to the assignee of the present invention, the disclosure of which is incorporated herein by reference. However, unlike the patent, the present invention includes the instrument card relays in each instrument housing, rather than connecting instruments to the instrument card relays over separate discrete wires.

Figure 3:
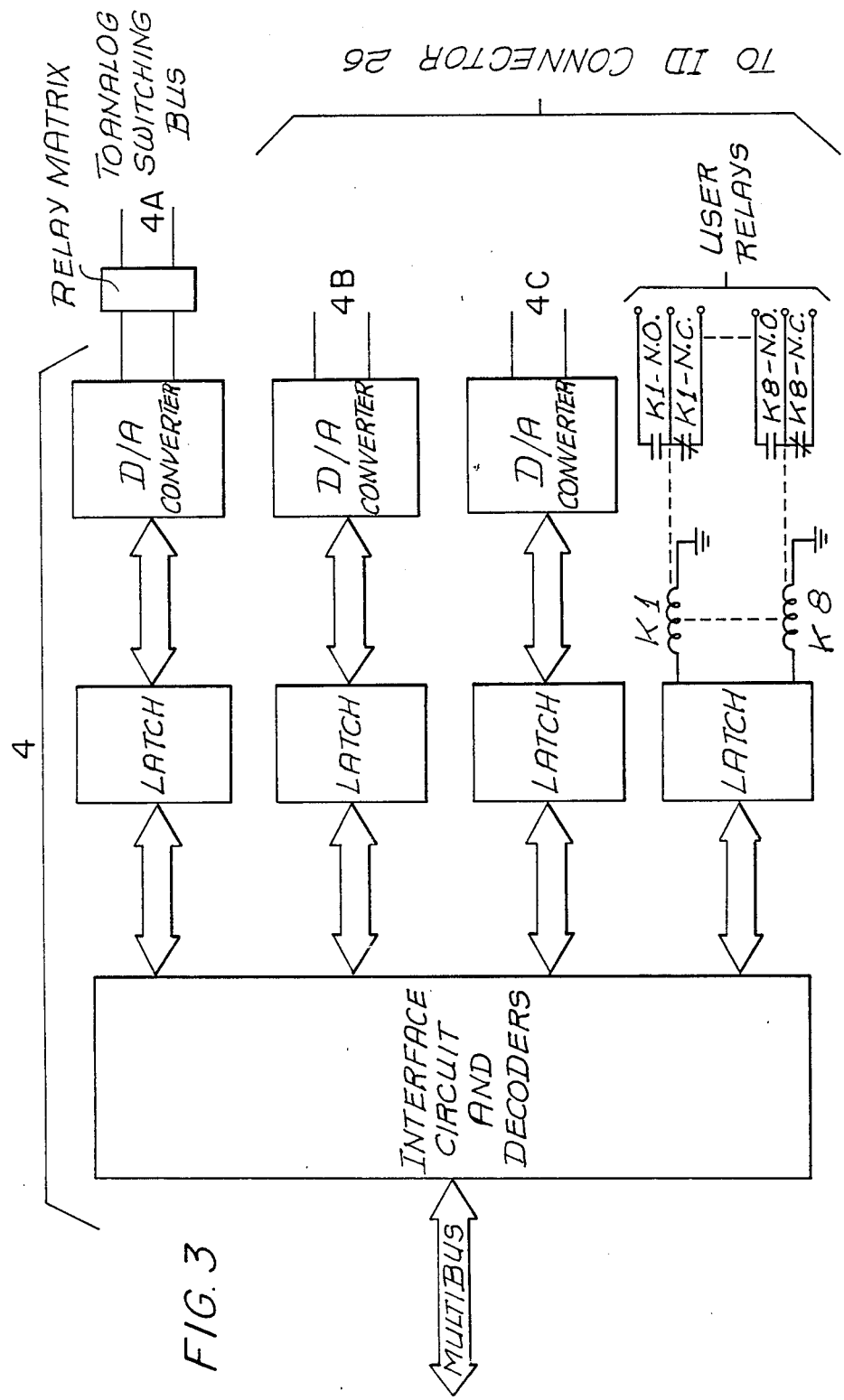
FIG. 3 is a functional block diagram of a programmable precision voltage source.

A prior art programmable stimulus subsystem includes one or more of the following units: (a) programmable voltage source 4, (b) programmable function generator 5, and (c) programmable pulse generator 6. These provide desired stimuli to the unit under test. A functional block diagram of programmable precision voltage source 4 is illustrated in FIG. 3. The programmable precision voltage source contains three precision voltage sources and eight SPDT user relays. One precision voltage source 4A is connected to the analog switching bus while the remaining two precision voltage sources 4B and 4C are routed directly to the ID interface connector 26. The N.O., N.C. and common terminal of each of the eight relays are brought to the ID interface connector 26. The three precision DC voltage sources and the eight user relays are all under program control and are independent of one another. Commands from its instrument driver to this instrument pass over the system bus 25.

Figure 4:
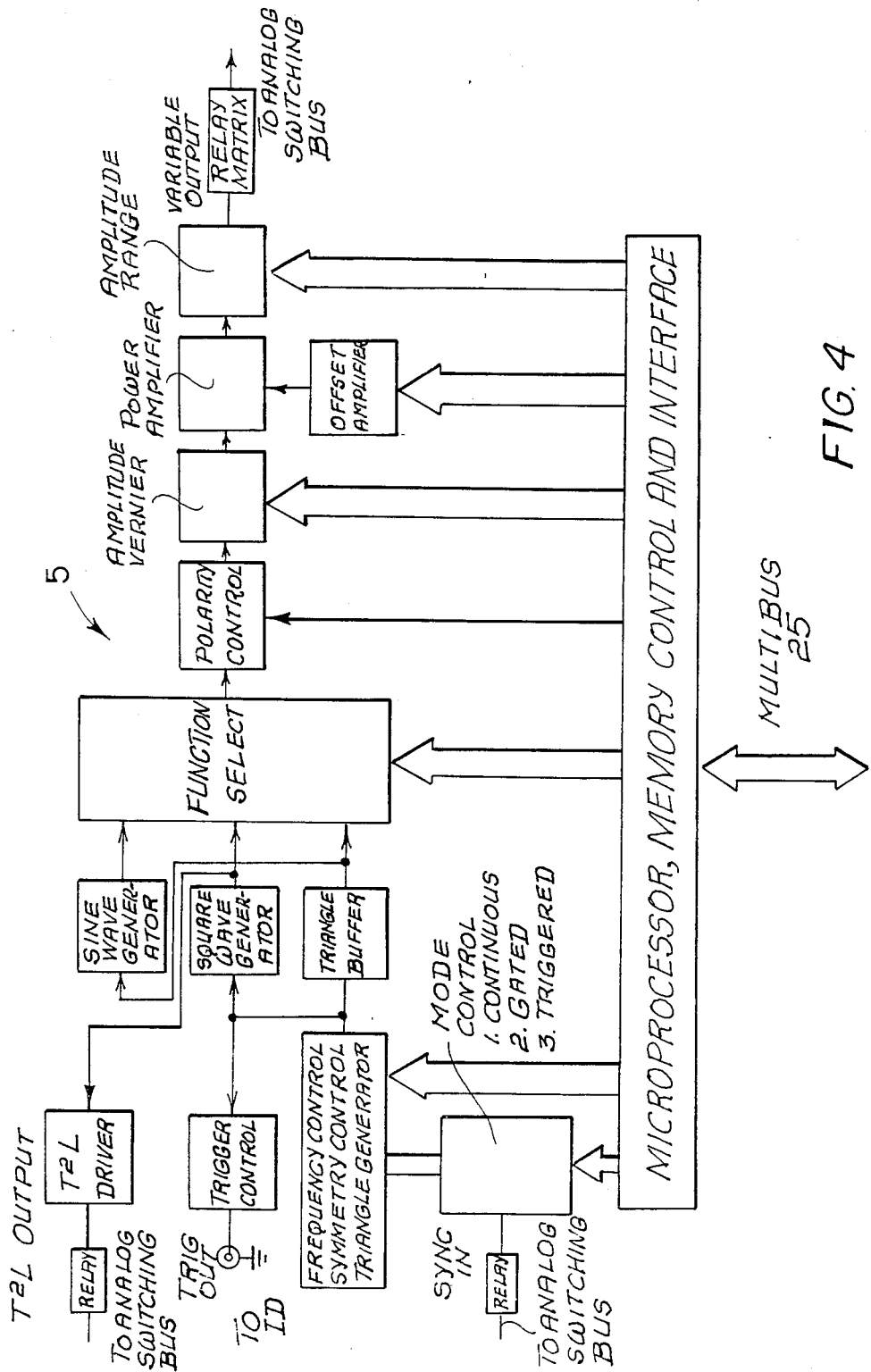
FIG. 4 is a functional block diagram of a programmable function generator.

A funtional block diagram of a prior art programmable function generator 5 is illustrated in FIG. 4. The programmable function generator provides a variety of UUT test stimuli including triangle, sine wave, and pulse signals from its variable amplitude output and TTL compatible signals from its TTL output. The programmable function generator provides a trigger output signal and can be synchronized from an external source. The amplitude, frequency, selection of sync source, and output function (i.e., triangle, sine wave, pulse) are all under program control. Parameters and commands are sent to the programmable function generator from its instrument driver via the system bus 25.

Figure 5:
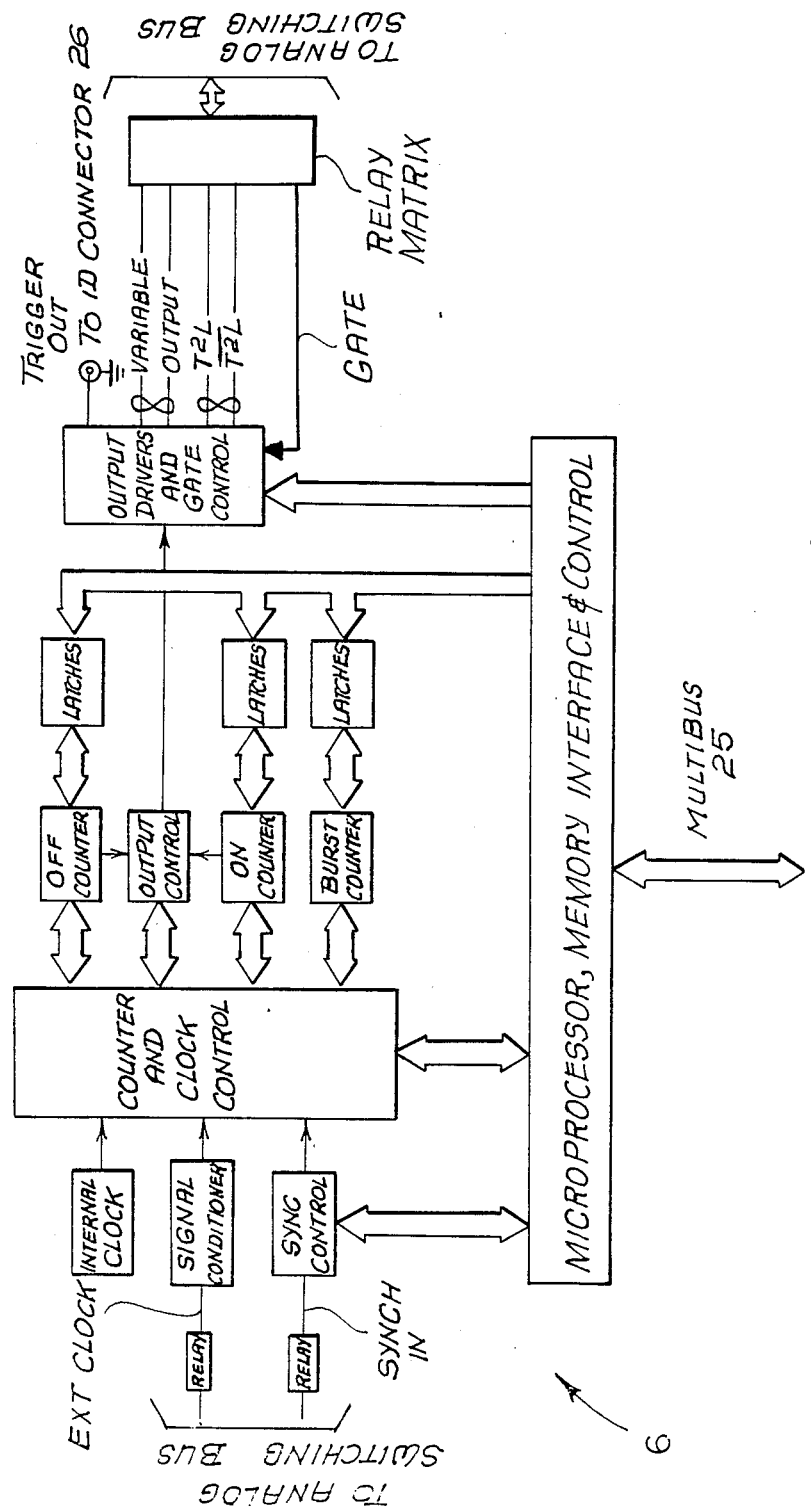
FIG. 5 is a functional block diagram of a programmable pulse generator.

A functional block diagram of a prior art programmable pulse generator 6 is illustrated in FIG. 5. The programmable pulse generator also provides a variety of UUT test stimuli. It has two main outputs, one is variable in amplitude, the other is a differential TTL compatible output. The delay time, on time, and off time of the two outputs are programmable. The amplitude of the variable output is programmable. The programmable pulse generator can be run from an external clock under program control. It has three control signals: Gate and Sync inputs which can be selected under program control, and trigger output. Parameters and commands are sent to the programmable pulse generator from its instrument driver via the system bus 25.

Figure 6:
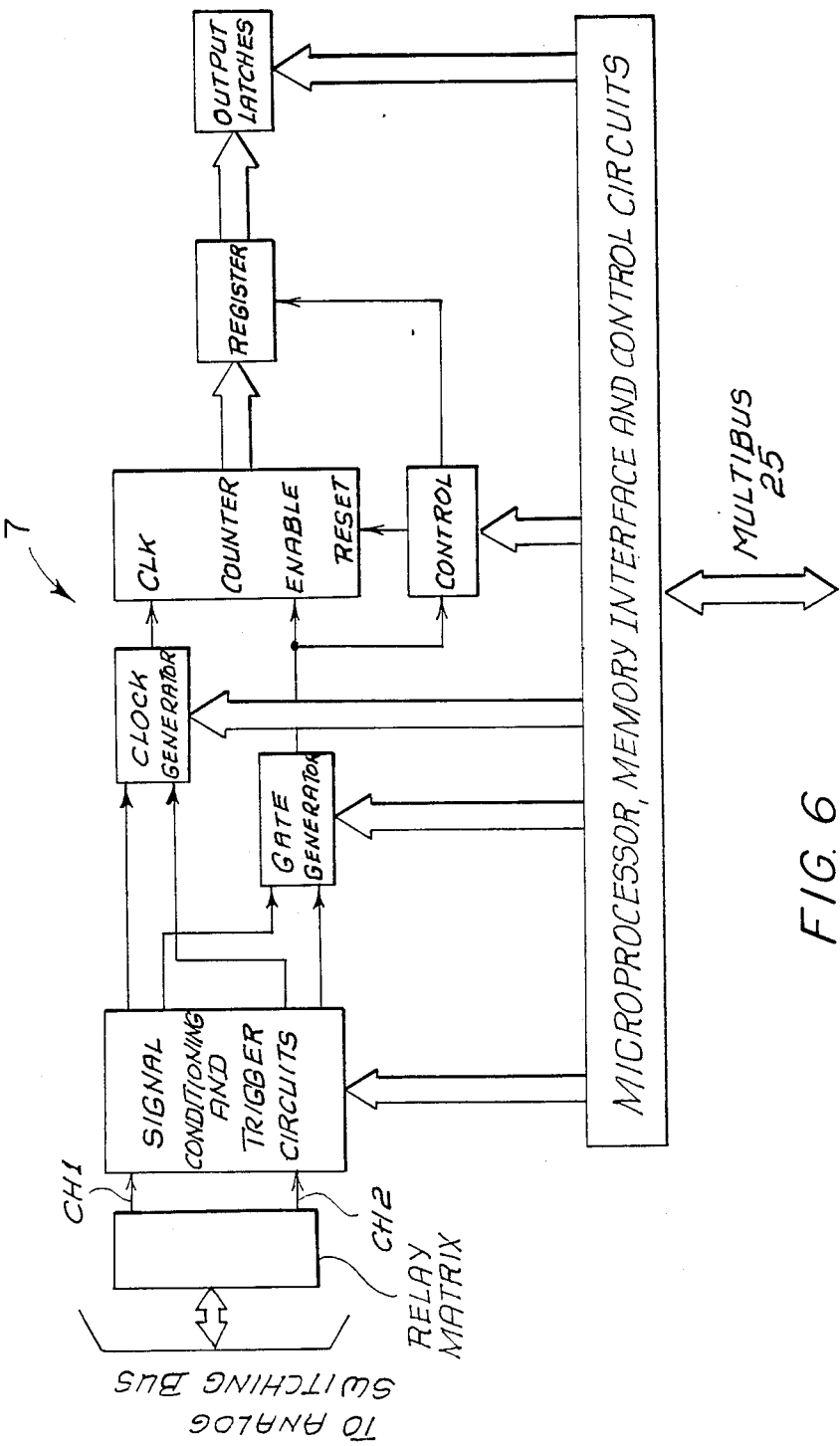
FIG. 6 is a functional block diagram of a programmable counter/timer.

A prior art programmable response measuring subsystem includes either or both the (a) programmable counter/timer 7 and (b) programmable digital multimeter 8 which measures specified output parameters of the unit under test. A functional block diagram of a prior art programmable counter/timer 7 is illustrated in FIG. 6. The operational details thereof are described in U.S. Pat. No. 4,507,740, granted on Mar. 26, 1985, to Albert A. Star and John M. Weick, entitled "Programmable Signal Analyzer," and assigned to the assignee of the present invention, the disclosure of which is incorporated herein by reference. The programmable counter/timer measures specified UUT output parameters. It has two inputs CH1 and CH2. CH1 is used to measure frequency, counts, and pulse widths. CH1 and CH2 are used together to measure time intervals between two events. The mode of operation (i.e., frequency, count, pulse width, time interval range, and input threshold level are all programmable). Parameters and commands are sent to the programmable counter/timer and data is read back from the programmable counter/timer to its instrument driver via the system bus 25.

Figure 7:
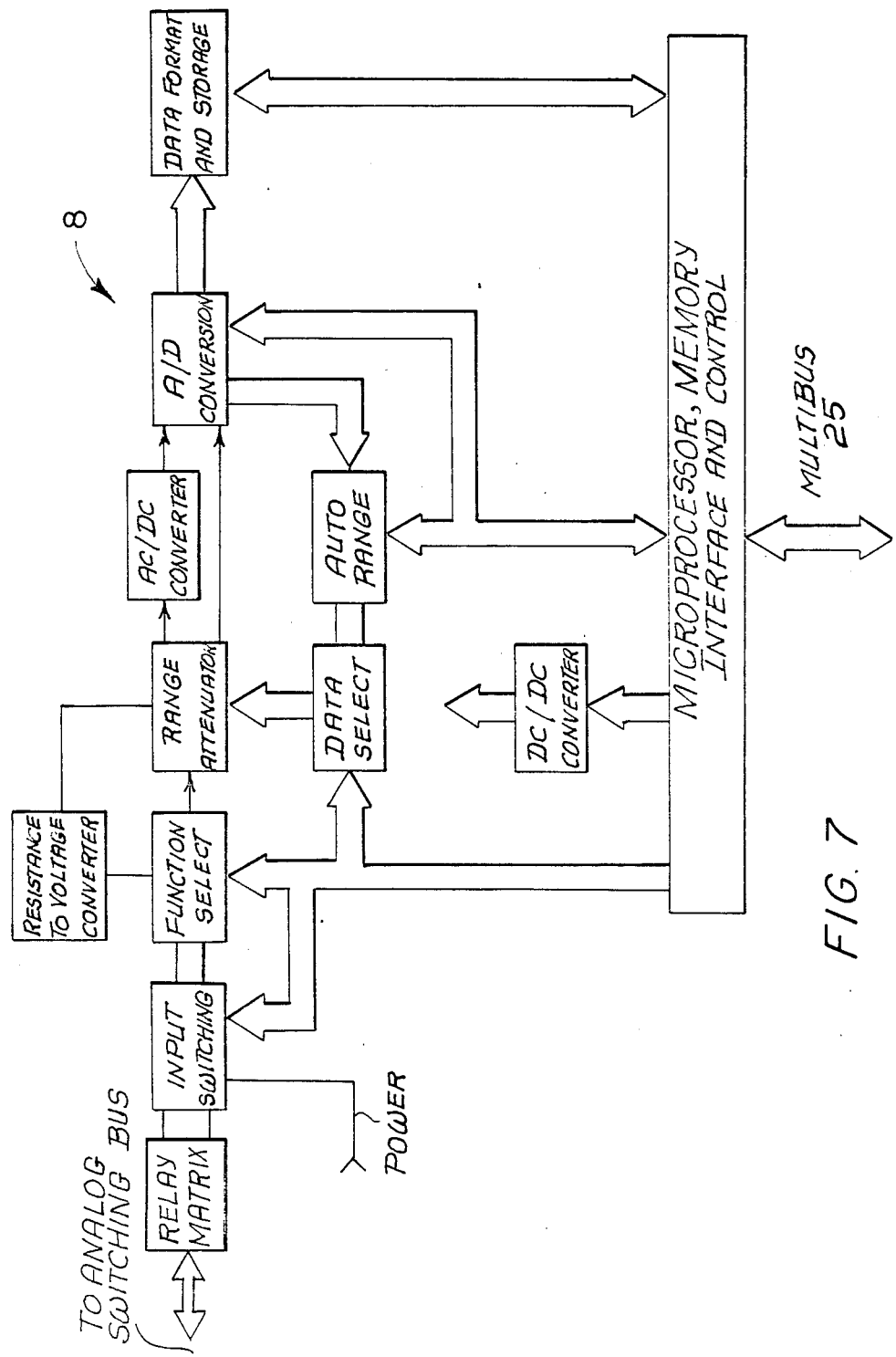
FIG. 7 is a functional block diagram of a programmable digital multimeter.

A block diagram of a prior art programmable digital multimeter 8 is illustrated in FIG. 7. The operational details thereof are described in the aforementioned patent of Star and Weick. The programmable digital multimeter also measures specified UUT output parameters. It is capable of measuring DC volts, AC volts, and ohms. The mode, i.e., DC volts, AC volts, ohms, and ranges within each mode are all programmable. Parameters and commands are sent to the programmable digital multimeter and data is read back from the digital multimeter to its instrument driver via the system bus 25.

Figure 8:
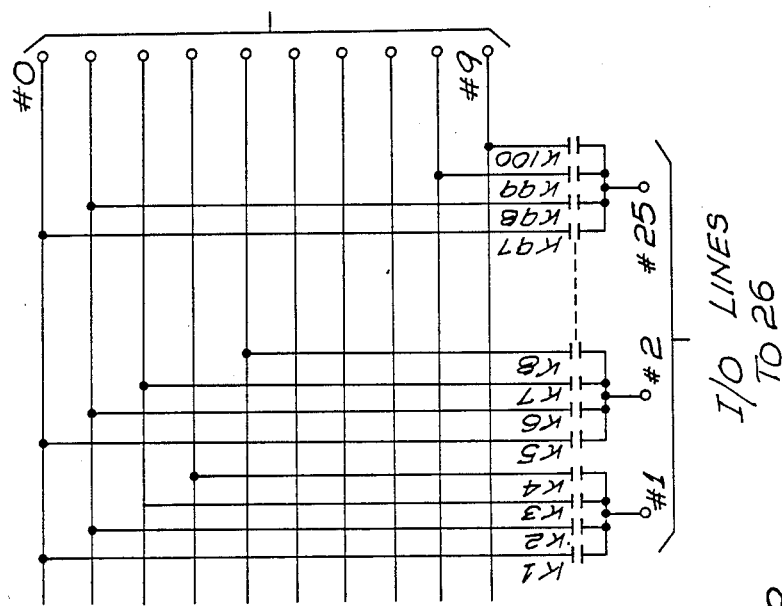
FIG. 8 is a functional block diagram of a programmable smart switch.
Figure 8:
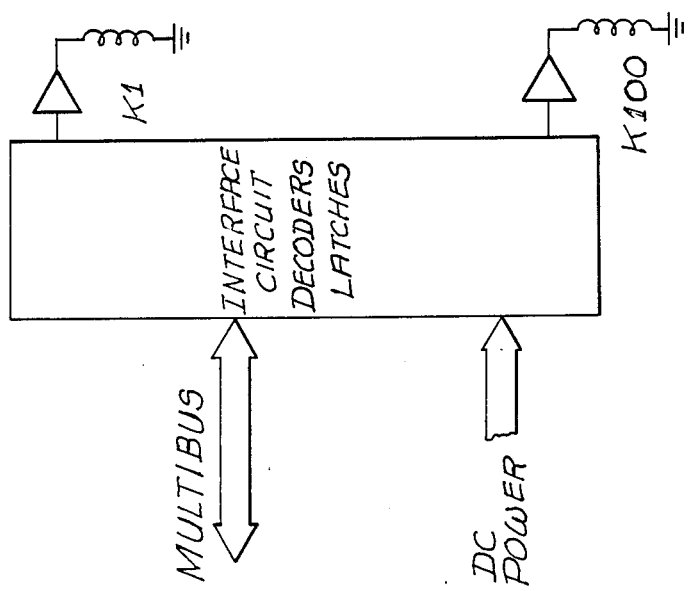

A block diagram of programmable I/O smart switch 11 is illustrated in FIG. 8. The smart switch together with the relays on the individual instruments are the equivalent of a multiple matrix switching system. The operational details thereof are similar to those described in the aforementioned U.S. patent of Eivers and Kovacs. The programmable I/O smart switch has mounted on it the latches, relay driver, and relays which connect the analog switching bus to the coax I/O lines which go to the ID interface connector 26. Relay commands and status signals are sent between the programmable smart switch and its driver via the system bus 25.

Video terminal 12 operates in at least two basic modes: (1) under control of an ATLAS programmer and (2) under control of the executive program. When operated under control of the ATLAS programmer, the programmer can use terminal 12 as he chooses to aid the operator in running the specific test program. The programmer can, for example, display the value of a digital multimeter reading or he can inform the operator that an adjustment must be made on the UUT. When operated under control of the executive program, the executive program uses terminal 12 to pass information to the operator concerning matters other than a specific ATLAS test program. For example, the operator is informed of the results of Self Test and is given cues to install the ID and UUT prior to beginning an ATLAS test program.

Figure 9:
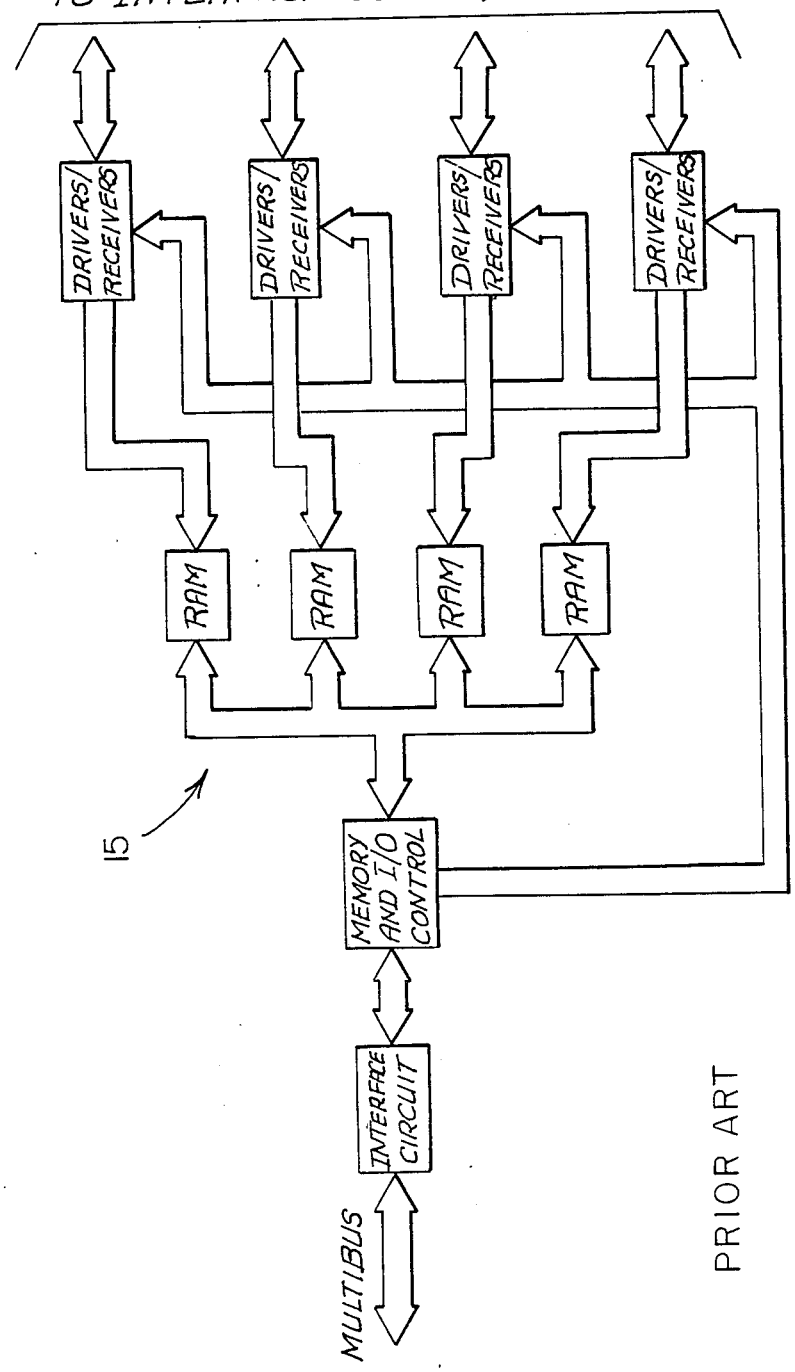
FIG. 9 is a functional block diagram of a programmable digital signal generator.

A block diagram of the programmable digital signal generator/receiver 15 is illustrated in FIG. 9. The programmable digital signal generator/receiver may, for example, contain 32 digital signal lines arranged in four groups of eight lines each. Each group can be independently programmed as an output group or an input group. Commands and data pass between the programmable digital signal generator/receiver and its instrument driver via the system bus 25. The inputs and outputs of the programmable digital signal generator/receiver are TTL compatible.

As configured, the programmable tester includes a number of programmable DC power supplies 16, typically eight, which are used to provide power to the UUT. The power supplies 16 are similar to the precision voltage source of FIG. 3 except have output buffer amplifiers to provide a higher power output. These power supplies are programmed automatically using the ATLAS test program. A standard power supply 19 such as, for example, the LH Research Style MML 47 Power Supply is used to provide DC power for the tester circuits and to circuits in the ID, if necessary. The power supply has several output DC voltages.

Transfer relays 20, such as, for example, MS 27401-1, switch the AC and DC power to the UUT. AC power is switched under program control. DC power is also under program control but cannot be switched until all UUT supply voltages are within tolerance.

A standard filter 23 may be used to decrease the coupling of noise between the tester and the user's AC input power line. A standard combination circuit breaker on/off switch 24 is provided on the front panel of the tester.

The ID interface connector 26 consists of a well on the horizontal surface of the tester front panel and zero insertion force connectors at the bottom of the well. A typical ID would plug into the connectors at the bottom of the well. The ID utilizes mating connectors depending on the particular signals to which it must connect.

The Interface Device (ID) is a plug-in adapter that provides the electrical/mechanical interface via connectors, wiring, and in addition provides room for locating circuitry for modification of signals if necessary. The ID is not part of the programmable tester but does plug into it.

An ID is prepared in the following manner:

(1) obtain schematic diagram of particular UUT and specifications on UUT connectors;

(2) mount mating connectors for UUT on ID;

(3) obtain tester interface drawings;

(4) analyze UUT to determine test requirements and need for special interface circuits (if required);

(5) write the test program for the UUT in the DOD standard test language ATLAS;

(6) the bubble memory holds the IC version of the ATLAS test program. The test program is initially written by a test programmer in ATLAS. It is then compiled and converted into intermediate code (IC) then loaded into a bubble memory;

(7) the IC program is now loaded into one or more bubble memory cassettes. By using such cassettes, each test program may become operational with a separate cassette.

The operation of the programmable tester illustrated in FIGS. 1A and 1B is as follows. Immediately following turn on of the tester, the operation of the tester is under control of microcomputer 2. Turning the tester on causes microcomputer 2 to begin executing a monitor program which is stored in a non-volatile memory of the microcomputer 2. This program will cause initialization of the tester hardware and then prompt the operator to load the test executive program from a bubble cassette memory. The executive program will automatically perform a confidence test of the tester to insure that it is operating properly.

The executive program is written so that the operator will be notified via terminal 12 if failure within the tester exists and the suspect subsystems will be listed. If the tester is operating properly, the executive program will cause the terminal 12 to indicate to the operator that he should insert the proper UUT (Unit Under Test) and then actuate the system. Upon actuation, the executive program will cause microcomputer 2 to read the IC form of the test program from the bubble memory 14 and load it into the memory on microcomputer 2. Upon completion of a load operation, the executive program will cause terminal 12 to display the name of the UUT using data supplied from the test program.

The executive program will then cause terminal 12 to prompt the operator to continue and the ATLAS test program (in IC form) directs the microcomputer 2 to perform the test.

The tester itself is essentially automatic in operation including programming the power supplies. Unless the UUT requires manual intervention, the test will run automatically to completion.

It is clear that the above description of the preferred embodiment in no way limits the scope of the present invention which is defined by the following claims.

I claim:

1. Programmable test apparatus comprising:
   (a) connecting means for receiving interface means configured to adapt a unit under test to said test apparatus, said interface means cooperating with bubble memory means, the latter storing a plurality of test programs written in a high level language and converted to interpretive code format for selectively testing the operation of said unit under test;
   (b) system bus means;

(c) microcomputer means operatively connected to said system bus means and including means for executing each test program;
(d) memory means associated with said microcomputer means operatively connected to said system bus means and including means for storing an interpreter program for interpreting the interpretive code format test program;
(e) programmable stimulus generating means operatively connected via said system bus means to said microcomputer means;
(f) programmable response measuring means operatively connected via said system bus means to said microcomputer means;
(g) switching means included in the stimulus generating and response measuring for selectively connecting said stimulus generating means and said response measuring means via said interface means to said unit under test, said switching means responsive to and operatively connected via a switching control bus means to said microprocessor control means;
(h) programmable digital signal generating means operatively connected via said system bus means to said microcomputer means and including means for effecting data communication directly via said interface means with said unit under test; and
(i) terminal means operatively connected to said microcomputer means for initiating execution of said test program and displaying the results thereof.

2. Programmable test apparatus as recited in claim 1 wherein the high level language in ATLAS.

3. Programmable test apparatus comprising:
(a) connecting means for receiving interface means configured to adapt a unit under test to said test apparatus, said interface means cooperating with bubble memory means for storing a plurality of test programs written in a high level language and converted to interpretive code format for selectively testing the operation of said unit under test;
(b) system bus means;
(c) microcomputer means operatively connected to said system bus means and including means for executing each test program;
(d) memory means associated with said microcomputer means operatively connected to said system bus means and including means for storing an interpreter program for interpreting the interpretive code format test program;
(e) programmable stimulus generating means operatively connected via said system bus means to said microcomputer means;
(f) programmable response measuring means operatively connected via said system bus means to said microcomputer means;
(g) first switching means integrally distributed amongst the stimulus generating means and the response measuring means for selectively connecting preselected stimulating generating means and response measuring means to an interconnecting analog switching bus, under direction of said microcomputer means; and
(h) second switching means connected between the analog switching bus and the unit under test for routing signals to preselected I/O lines of the unit under test.

4. The structure set forth in claim 3 wherein the high level language is ATLAS.

5. The structure set forth in claim 3 together with terminal means operatively connected to said microcomputer means for initiating execution of said test program and displaying the results thereof.

* * * * *

UNITED STATES PATENT AND TRADEMARK OFFICE
CERTIFICATE OF CORRECTION

PATENT NO. : 4,760,329

DATED : July 26, 1988

INVENTOR(S) : Richard J. Andreano

It is certified that error appears in the above-identified patent and that said Letters Patent is hereby corrected as shown below:

Column 1, line 43, change "indentification" to --identification--.

Column 7, line 16, after "measuring" insert --means--.

Column 7, line 32, change "in" to --is--.

Signed and Sealed this

Tenth Day of January, 1989

Attest:

DONALD J. QUIGG

Attesting Officer

Commissioner of Patents and Trademarks